(12) United States Patent
Pyo

(10) Patent No.: US 6,528,415 B2
(45) Date of Patent: Mar. 4, 2003

(54) METHOD OF FORMING A METAL LINE IN A SEMICONDUCTOR DEVICE

(75) Inventor: Sung Gyu Pyo, Ichon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 09/888,539

(22) Filed: Jun. 26, 2001

(65) Prior Publication Data

US 2002/0016061 A1 Feb. 7, 2002

(30) Foreign Application Priority Data

Jun. 26, 2000 (KR) ........................................ 2000-35351

(51) Int. Cl.[7] .......................................... H01L 21/4763
(52) U.S. Cl. ...................... 438/639; 438/637; 438/638; 438/680; 438/681
(58) Field of Search ................. 438/680–687, 438/639–640

(56) References Cited

U.S. PATENT DOCUMENTS 6,017,817 A * 1/2000 Chung et al. ............... 438/637
6,309,970 B1 * 10/2001 Ito et al. ..................... 438/687
6,319,728 B1 * 11/2001 Bhan et al. ................. 438/687

* cited by examiner

Primary Examiner—David Nelms
Assistant Examiner—D Le
(74) Attorney, Agent, or Firm—Finnegan, Henderson, Farabow, Garrett & Dunner, L.L.P.

(57) ABSTRACT

A method of forming a metal line in a semiconductor device comprises forming a damascene pattern, forming a diffusion barrier layer, depositing a copper precursor by a spin-on process, forming a thin copper film by a baking process, filling the damascene pattern by a hydrogen reduction annealing process and a force filling process, and then forming a copper line by a chemical mechanical polish method. As such, the method forms a copper line without forming a seed layer by simultaneously performing a hydrogen reduction annealing process and a force filling process, by introducing a spin-on process. Therefore, the method can simplify the process, reduce the manufacturing cost, and easily form a copper line.

11 Claims, 2 Drawing Sheets

METHOD OF FORMING A METAL LINE IN A SEMICONDUCTOR DEVICE

BACKGROUND OF THE INVENTION

1. Field of the Invention

The invention relates generally to a method of forming a metal line in a semiconductor device. More particularly, the present invention relates to a method of forming a metal line in a semiconductor device and forming a selective copper line.

2. Description of the Prior Art

In manufacturing a semiconductor device, a thin copper film can improve the reliability of the semiconductor device due to its higher melting point compared with aluminum and can increase the signal transfer speed because of its low resistivity. Thus, the technology of forming a thin copper film is a technology useful in higher-speed devices and higher-integration devices.

The current method of depositing a thin copper film employs an electro-plating method. The electro-plating method, however, increases the process cost and is sensitive to the process of depositing a seed layer due to its complicated chemical properties. Therefore, it is difficult to establish an optimal condition suitable for the electro-plating method. In the electro-plating method, copper ions are moved by an electric field flowing along the seed layer, thus forming a copper film. If the seed layer is not uniform, a potential drop is generated causing a non-uniform electrolytic layer. Thus, there is a problem that the non-uniform electrolytic layer causes via and voids in the trench structure, thus degrading the characteristics of the copper line.

SUMMARY OF THE INVENTION

The present invention to provides a method of forming a metal line in a semiconductor device capable of forming a copper line without forming a seed layer.

In order to accomplish this, a method of forming a metal line in a semiconductor device according to the present invention comprises providing a substrate where a damascene pattern is formed in an interlayer insulating film, forming a diffusion barrier layer on the entire structure in which said damascene pattern is formed, depositing a copper precursor on said diffusion barrier layer, changing said copper precursor into a porous copper layer by means of a baking process, performing a hydrogen reduction annealing process and a force filling process to form a copper layer in which said damascene pattern is completely filled on said porous copper layer, and forming a copper line by polishing said copper layer.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to the accompanying drawings.

Figure 1A:
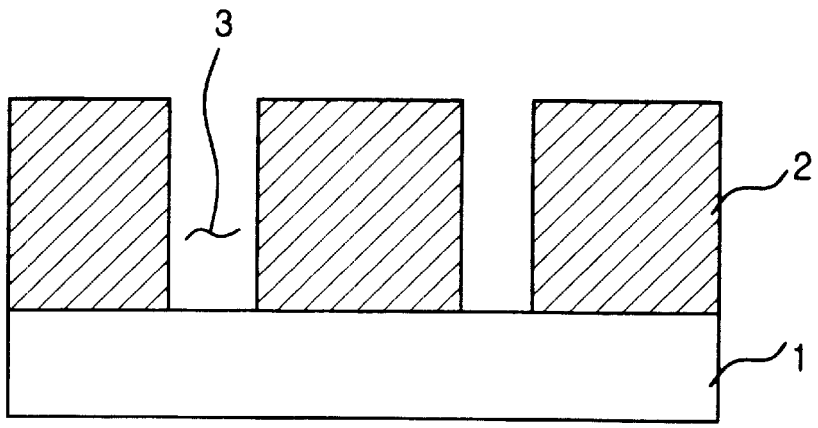
FIGS. 1a through 1f are cross-sectional views sequentially illustrating a method of forming a metal line in a semiconductor device according to one embodiment of the present invention.

Referring now to FIG. 1a, an interlayer insulating film 2 is formed on a semiconductor substrate 1 in which various components for forming a semiconductor device are formed. A damascene pattern 3 consisting of a via and/or trench is then formed by a single damascene method or a dual damascene method. Next, in order to remove by-products generated when the damascene pattern 3 is formed, a cleaning process is performed.

At this time, the interlayer insulating film 2 is formed of an insulating material having a low dielectric constant by means of a spin-on method or chemical vapor deposition method (CVD). The cleaning process, after forming the contact/line, may use an RF plasma method if an underlying layer is made of W or Al. Where the underlying metal layer is made of Cu, a reactive cleaning method may be employed.

Figure 1B:
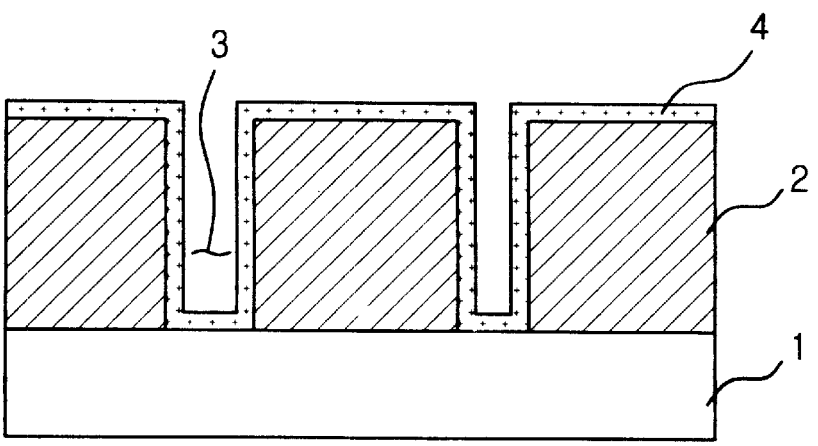

Referring now to FIG. 1b, a diffusion barrier layer 4 is formed. At this time, the diffusion barrier layer 4 may employ ionized PVD TiN film, CVD TiN film, MOCVD TiN film, ionized PVD Ta film, ionized PVD TaN film, CVD Ta film, CVD TaN film, CVD WN film, PVD TiAlN film, PVD TiSiN film, PVD TaSiN film, CVD TiAlN film, CVD TiSiN film, or CVD TaSiN film.

Figure 1C:
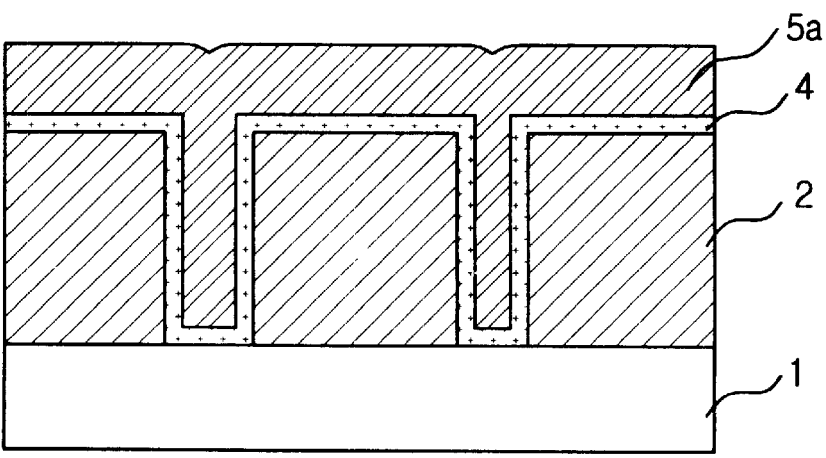

Referring now to FIG. 1c, a Cu precursor is deposited having a thickness of between 1.0 and 1.5 gm by a spin-on method at the rate of 100 to 5000 rpm at a temperature of −10 to 100° C.

In the above, during the spin-on deposition, the spin-on deposition is performed at the maximum speed of 5000 rpm, during the initial stage of 1 to 10 seconds.

Figure 1D:
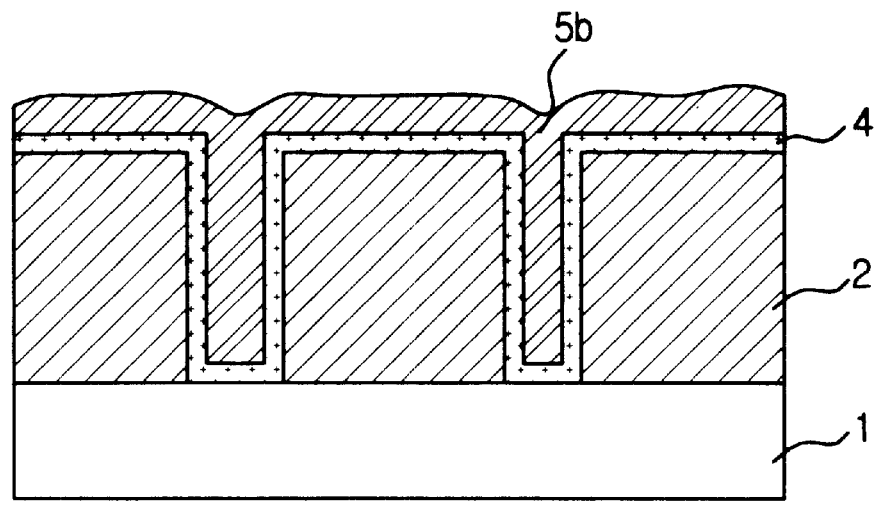

Referring now to FIG. 1d, in order to remove polymer components from a spin-on copper layer 5a, a baking process is performed under a hydrogen atmosphere at a temperature between of 200 and 500° C., which is performed in a single step or multiple steps. In case of the single step process, baking is performed at a single temperature of the temperature range from 200° C. to 500° C. for 1 second to 10 minutes. In case of the multiple step, baking is performed at multiple temperatures in a temperature range from 200° C. to 500° C. for 1 second to 10 minutes.

The baking process is performed for 1 minute to 3 hours by forming a hydrogen atmosphere using only $H_2$ or a mixture gas such as $H_2+Ar$(0.1 to 95%) or $H_2+N_2$(0.1 to 95%). When the baking is performed, the spin-on copper layer 5a becomes a porous film and some of it becomes a porous copper layer 5b existing in the form of a copper oxide film.

Figure 1E:
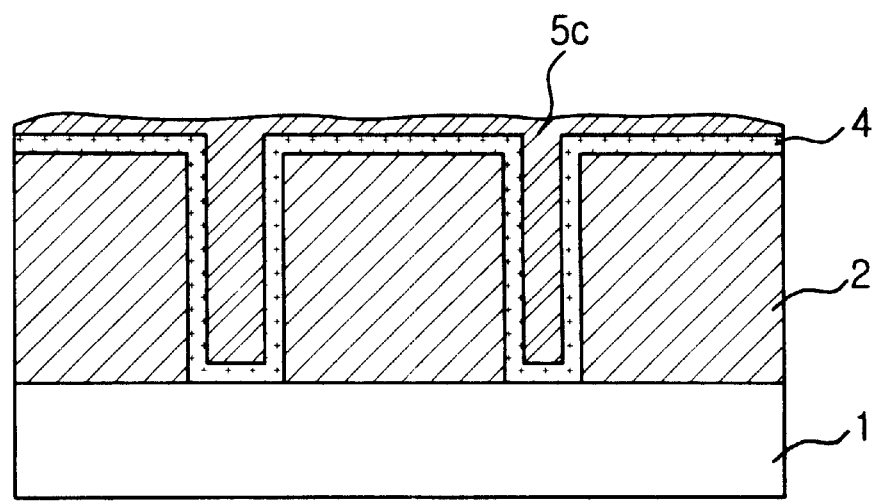

Referring now to FIG. 1e, the density of the porous copper layer 5b is increased and the copper oxide film is removed, by simultaneously performing a hydrogen reduction annealing process and a force filling process, thus forming a thin copper film 5c. The hydrogen reduction annealing process is performed under a hydrogen atmosphere at a temperature of 200° C. to 500° C. for 1 minute to 10 minutes. Also, the force filling process is performed at a pressure of 0.1 Mpa to 100 Mpa.

At this time, the force filling process is performed one (1) to ten (10) times by a single step pressure, a multiple-step pressure, or a sine-curve shaped pressure. When the pressure is applied using the single step and the multiple-step, a single gas and a mixture gas may be used. Where the multiple-step process is followed, after using a single hydrogen gas or a mixture gas of hydrogen, argon, and helium, hydrogen gas is used.

Figure 1F:
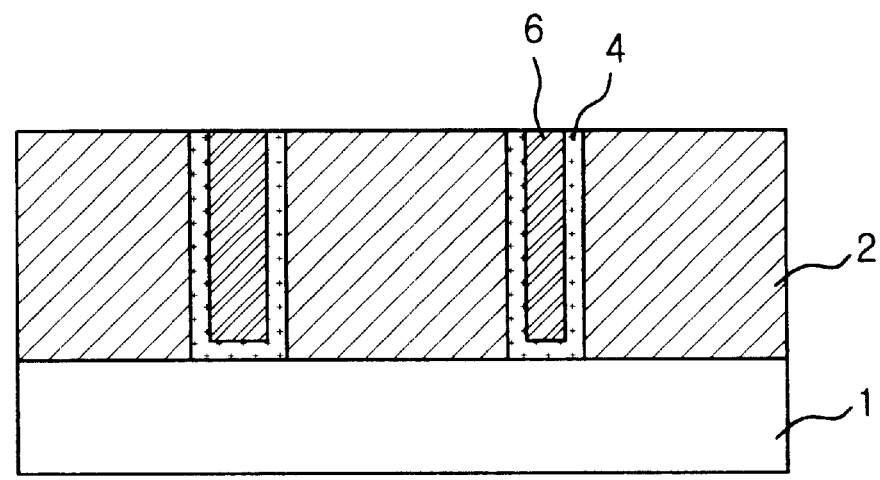

Referring now to FIG. 1f, the thin copper film 5c and the diffusion barrier layer 4 are polished by chemical mechanical polishing until the surface of the interlayer insulating film 2 is exposed. A post cleaning process is then performed to form a copper line 6 within the damascene pattern 3.

As mentioned above, the present invention forms a copper line without forming a seed layer by simultaneously performing a hydrogen reduction annealing process and a force filling process, by introducing a spin-on process. Therefore, the present invention can simplify the process, reduce the manufacturing costs, and easily form a copper line.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a metal line in a semiconductor device, comprising:

providing a substrate where a damascene pattern is formed in an interlayer insulating film;

forming a diffusion barrier layer on the entire structure in which said damascene pattern is formed;

depositing a copper precursor on said diffusion barrier layer;

changing said copper precursor into a porous copper layer by means of a baking process;

performing a hydrogen reduction annealing process and a force filling process to form a copper layer in which said damascene pattern is completely filled by said porous copper layer; and forming a copper line by polishing said copper layer.

2. The method of forming a metal line in a semiconductor device according to claim 1, wherein said interlayer insulating film is formed of an insulating material having a low dielectric constant, by means of a spin-on process or chemical vapor deposition process.

3. The method of forming a metal line in a semiconductor device according to claim 1, wherein said copper precursor is deposited at a thickness of between 1.0 and 1.5 μm by spin-on process at a rate of 100 to 5000 rpm at a temperature of −10 to 100° C. where a maximum speed is maintained during an initial stage of 1 to 10 seconds.

4. The method of forming a metal line in a semiconductor device according to claim 1, wherein during said baking process, a temperature is in the range of 200 to 500° C.

5. The method of forming a metal line in a semiconductor device according to claim 4, wherein said baking process is performed at a single temperature of a temperature range from 200° C. to 500° C. for 1 second to 10 minutes.

6. The method of forming a metal line in a semiconductor device according to claim 4, wherein said baking process is performed at multiple temperature ranges of a temperature range from 200° C. to 500° C. for 1 second to 10 minutes.

7. The method of forming a metal line in a semiconductor device according to claim 1, wherein said baking process is performed under one of $H_2$, $H_2+Ar$, 0.1 to 95%, and $H_2+N_2$, 0.1 to 95%, for 1 minute to 3 hours.

8. The method of forming a metal line in a semiconductor device according to claim 1, wherein said hydrogen reduction annealing process is continuously performed after said baking process and is performed at a temperature of 200° C. to 500° C. for 1 to 10 minutes.

9. The method of forming a metal line in a semiconductor device according to claim 1, wherein said force filling process is performed at one pressure of a pressure in a range of from 0.1 Mpa to 100 Mpa.

10. The method of forming a metal line in a semiconductor device according to claim 1, wherein said force filling process is performed under an atmosphere of a single hydrogen gas or a mixture gas of hydrogen, argon and helium.

11. The method of forming a metal line in a semiconductor device according to claim 1, wherein said hydrogen reduction annealing process and said force filling process are performed for one to ten times repeatedly.

* * * * *